United States Patent [19]

Tanaka

[11] 4,241,449
[45] Dec. 23, 1980

[54] MEMORY SAVING ALL-CHANNEL DIGITAL TELEVISION RECEIVER

[75] Inventor: Akio Tanaka, Chicago, Ill.

[73] Assignee: Zenith Radio Corporation, Glenview, Ill.

[21] Appl. No.: 840,341

[22] Filed: Oct. 7, 1977

[51] Int. Cl.³ .............................................. H04N 1/26
[52] U.S. Cl. ..................................... 455/186; 455/200
[58] Field of Search ............... 325/464, 465, 468, 470, 325/453, 459, 390; 358/191, 193, 194; 334/11, 14, 15

[56] References Cited

U.S. PATENT DOCUMENTS

| | | | |
|---|---|---|---|
| 3,940,702 | 2/1976 | Yoshimura et al. | 325/470 |
| 3,953,801 | 4/1976 | Podowski | 325/390 |
| 3,961,266 | 6/1976 | Tanaka | 325/468 |
| 3,979,680 | 9/1976 | Sakamoto | 325/464 |
| 4,023,107 | 5/1977 | Tanaka | 325/464 |
| 4,138,647 | 2/1979 | Wine | 325/464 |

FOREIGN PATENT DOCUMENTS

| | | | |
|---|---|---|---|
| 2542021 | 3/1977 | Fed. Rep. of Germany | 358/194 |
| 1437473 | 5/1976 | United Kingdom | 358/194 |

OTHER PUBLICATIONS

Seidler, et al. "Digital Tuning System"; Funkschau, vol. 48, No. 5, pp. 166-170, 2/27/76.

*Primary Examiner*—Marc E. Bookbinder
*Attorney, Agent, or Firm*—Thomas E. Hill

[57] ABSTRACT

An all-channel television receiver includes a memory address counter for scanning a limited location memory for channel numbers and additional receiver adjustment information in response to a channel number input. Further television function control memories and counters for adjustment thereof are provided and accessed by the address counter. Channel numbers and additional receiver adjustment information may be programmed into and deleted from the limited location memory. Unprogrammed channels are tunable by the system at nominal levels.

13 Claims, 5 Drawing Figures

MEMORY SAVING ALL-CHANNEL DIGITAL TELEVISION RECEIVER

CROSS REFERENCE TO RELATED PATENT APPLICATION

This application is related to but not dependent upon copending application Ser. No. 840,304 filed Oct. 7, 1977 now U.S. Pat. No. 4,176,499.

BACKGROUND OF THE INVENTION

This invention relates generally to digitally tuned television receivers and specifically to such receivers that incorporate memories for storing channel-related receiver adjustment information.

Memory saving is achieved with the invention by providing full receiver-adjustment data memory capability for only a limited number of channels, though the receiver can receive any televised channel signal, albeit without elaborate picture corrections. The television receiver is sequentially tunable to any channel by operation of a simple up/down switch or directly tunable via the input of a two digit channel number. The limited location adjustment data memory may provide storage of channel-related information such as fine tuning, color level, tint, antenna orientation, multipath signal correction, etc. In short, for a limited number of channels, the receiver may be individually programmed to a very high degree of sophistication.

There are a number of well-known all-channel television tuning systems. In U.S. Pat. No. 3,961,266, issued June 1, 1976 to the inventor, a system of sampling the oscillator to determine its frequency for providing direct tuning within a restricted freqency window by channel number is disclosed. The system also discloses a sixteen position (16×8 bits) programmable channel number memory for retention of the channel numbers of up to fifteen often-viewed television channels in any viewer-determined sequence. One position of the memory, which is unavailable for programming, is accessed whenever a channel number is directly entered into the system. The other programmed memory positions are sequentially accessed by clocking a memory address counter up or down. Unprogrammed memory positions are skipped in the "operate" mode. The system provides the viewer with the option of scanning among only pre-programmed television channels rather than being limited to selection of channels by input of two digit channel numbers.

In U.S. Pat. No. 4,023,107, dated May 10, 1977 and issued to the inventor, tuning is accomplished by channel numbers generated by a viewer-controlled channel number counter. The channel number display is observed until the desired channel number is produced. (The receiver instantly and automatically tunes to the television signal corresponding to the generated channel number.) The viewer may by operation of a skip/stop switch in the Program mode, store a stop signal in an 82×1 channel number addressed memory. Thereafter in the Operate mode, in response to an up/down switch, the channel number counters are clocked at high speed between programmed (selected) channel numbers.

The prior art also includes a variety of all-channel television receivers having a limited number of tuning positions, which are usually vertically oriented adjacent to the picture tube. Each position may be programmed to receive any of the 82 FCC allocated television channels by sequencing through the various positions and tuning in a desired channel at each position. Translucent channel number identification tabs corresponding to the number of the tuned channel are generally inserted adjacent to the tuning position. The receiver may be thereafter tuned either remotely or via an up/down switch. Some receivers incorporate push buttons at each tuning position and direct tuning to a programmed channel may be accomplished by pushing the appropriate button.

Each of these systems incorporates a memory having fewer locations than there are FCC allocated television channels. This represents a practical solution since only a very few of the 82 allocated channels are available in any given geographical area. Thus to provide memory of all 82 channels would not only prove cumbersome, but economically wasteful.

Memory costs are a function of memory size or capacity. Therefore, the larger the memory, whether in terms of number of words (locations) or length of words (bits), the greater the cost. The system of above-mentioned U.S. Pat. No. 3,961,266 includes a 16×8 memory to provide operational flexibility for the viewer, namely limited channel scanning in addition to direct channel selection by channel number. In the system of the above U.S. Pat. No. 4,023,107, direct access via channel number was omitted in favor of all-channel sequential operation with a simple 82×1 skip/stop memory. The other mentioned prior art systems incorporate memories in the form of potentiometers. There have also been all-channel systems which use digital to analog converters for storing tuning words of considerable length. The number of bits of information in memory greatly increases the system cost and complexity. As the trend toward providing even more tuning data to optimize viewing continues, the problem of memory size becomes of critical importance.

In accordance with the invention, significant memory capacity (to enable exceptional control of the displayed image) may be provided for a limited number of channels in an all-channel receiver without incurring enormous cost. In effect, the viewer is enabled to program his receiver with a lot of channel-related tuning information for any of a limited number of television channels while still retaining all-channel tuning capability by channel number. Further, the viewer is also not normally aware of any limitations in his receiver system since all channels are receivable at nominal settings.

To elaborate, viewer advantages are dramatic since at all times he may readily receive any desired channel on his receiver merely by entry of a desired channel number or operation of the up/down switch until the desired channel number appears in the display area. If the entered channel number is not one of those programmed in the limited position memory, the receiver is nominally tuned to the frequency corresponding to that channel number. In most cases an acceptable picture will result because the receiver fine tuning, color, tint, etc. controls are established in the factory at nominal settings. If the selected channel number corresponds to one that has been programmed into the limited position memory, the corresponding receiver adjustment information is read out and appropriate control signals developed in accordance therewith. The system automatically searches for the entered channel number among the limited locations of the memory. Thus for desired channels and often-viewed channels, very elaborate receiver adjustment information may be put into the memory and automatically read out to adjust the receiver controls for optimum viewing whenever the channel is selected. Indeed, corrective information regarding antenna orientation and "ghost signals" may be incorporated to produce a truly ideal picture. To provide capacity for such information for every channel would be prohibitive because of the enormous memory required. With the system of the invention only a relatively small limited location, memory need be utilized for selected channels.

OBJECTS OF THE INVENTION

The principal object of the invention is to provide a novel all-channel all-electronic television receiver tuning system.

Another object of this invention is to provide an improved all-channel all-electronic television receiver tuning system.

SUMMARY OF THE INVENTION

In accordance with the invention, an all-channel television receiver tuning system comprises means for generating channel numbers, tuning means for tuning the television receiver to the channel corresponding to the generated channel number, limited-location memory means for storing channel numbers channel tuning voltages and channel number-related additional receiver adjustment information for substantially less than all of said channel numbers, means scanning the memory locations in response to generated channel numbers, means reading out stored channel tuning voltages and additional receiver adjustment information and means programming said memory with desired channel numbers channel tuning voltages and channel number-related additional receiver adjustment information.

BRIEF DESCRIPTION OF THE DRAWINGS

Other objects and advantages of the invention will become apparent by reading the description in conjunction with the drawings, in which.

DESCRIPTION OF THE PREFERRED EMBODIMENT

Figure 1:
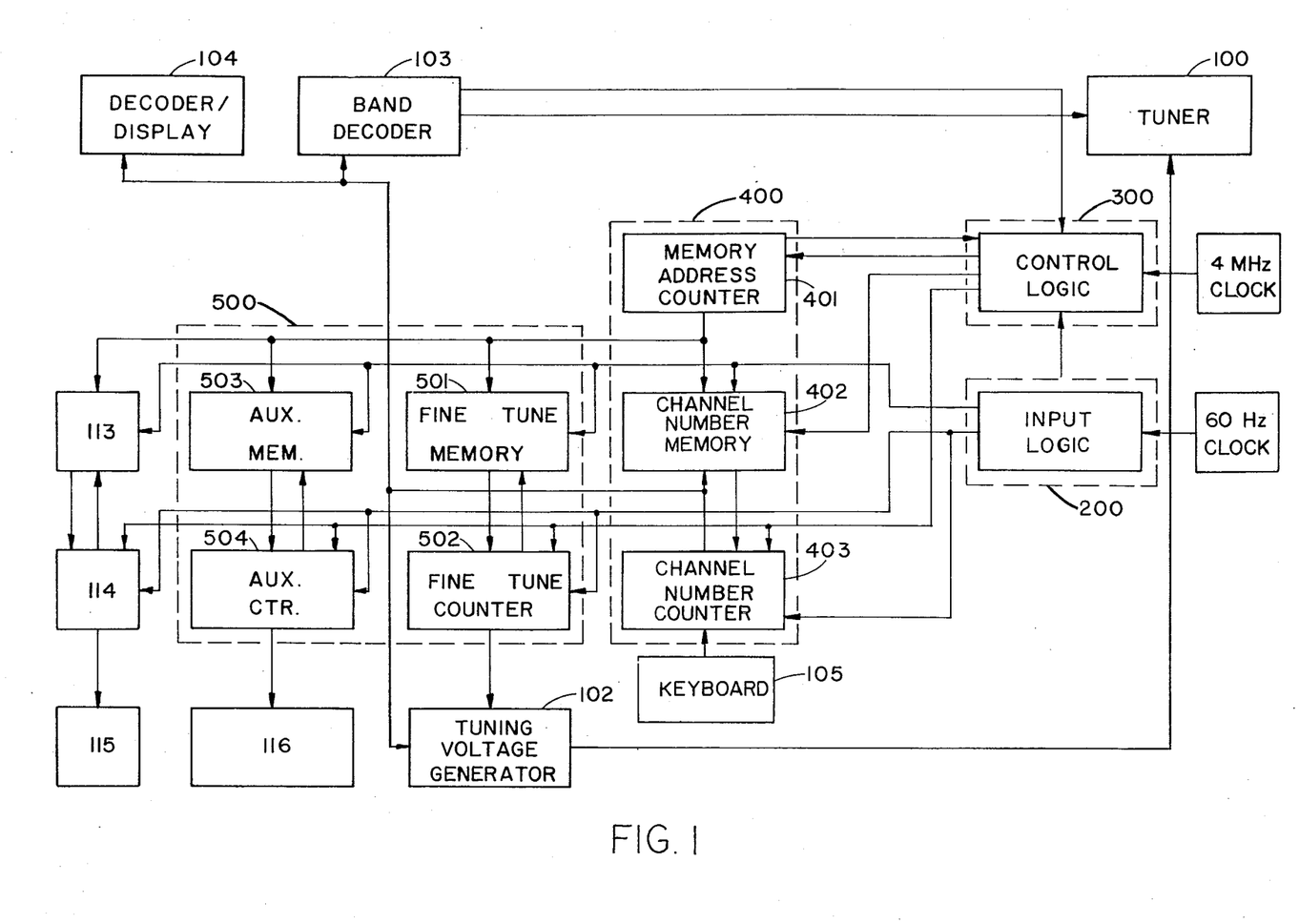
FIG. 1 is a block diagram of a television receiver tuning system constructed in accordance with the present invention.

Referring to the block diagram of FIG. 1, a tuner 100 is driven from a tuning voltage generator 102. Tuning voltage generator 102 may comprise any of a well-known number of television tuning systems which produce a potential for tuning to a selected television channel frequency in response to an input of the channel number corresponding to that channel frequency. The system described in the aforementioned U.S. Pat. No. 3,961,266 may be advantageously employed. A band decoder 103 supplies tuner 100 with appropriate frequency band switching information based upon the selected channel number and also supplies a control logic circuit 300. A decoder/display 104 yields a visual indication of the selected channel number to the viewer. Both the band decoder and the decoder/display are conventional. Those disclosed in the above-mentioned U.S. Pat. No. 3,961,266 are suitable.

A 4 MHz clock source drives control logic 300 and a 60 Hz clock source drives an input logic circuit 200. The channel number apparatus 400 is indicated by the dashed line block and includes a memory address counter 401 addressing a channel number memory 402 and a channel number counter 403 intercoupled with the memory. A block 500 delineates receiver adjustment apparatus and includes a fine tune memory 501 and an auxiliary memory 503 which, in turn, are functionally intercoupled with a fine tune counter 502 and an auxiliary counter 504, respectively. Channel number counter 403 is coupled to input logic 200 and control logic 300 and supplies tuning voltage generator 102, band decoder 103 and decoder/display 104 with channel number information. Control logic 300 and input logic 200 supply fine tune counter 502 and auxiliary counter 504 in receiver adjustment apparatus 500. The input logic is coupled to all memories. The fine tune counter supplies fine tuning information to tuning voltage generator 102. Auxiliary function counter 504 supplies a block 116 which should be understood to include the necessary apparatus for establishing a desired setting or adjustment of an appropriate characteristic of the receiver apparatus for the particular selected channel. The auxiliary function may comprise a well-known receiver characteristic such as color, tint, brightness, contrast, etc. or a characteristic such as antenna orientation or signal multipath correction circuitry. The particular apparatus used is not part of this invention and may be entirely conventional.

It should be apparent that more than one auxiliary function may conveniently be established for a selected channel. To illustrate this, blocks 113, 114 and 115 are provided and their connections to address counter 401 and input logic 200 shown. For the purpose of description however, only the apparatus enclosed within dashed line block 500 will be described in detail.

Figure 2:
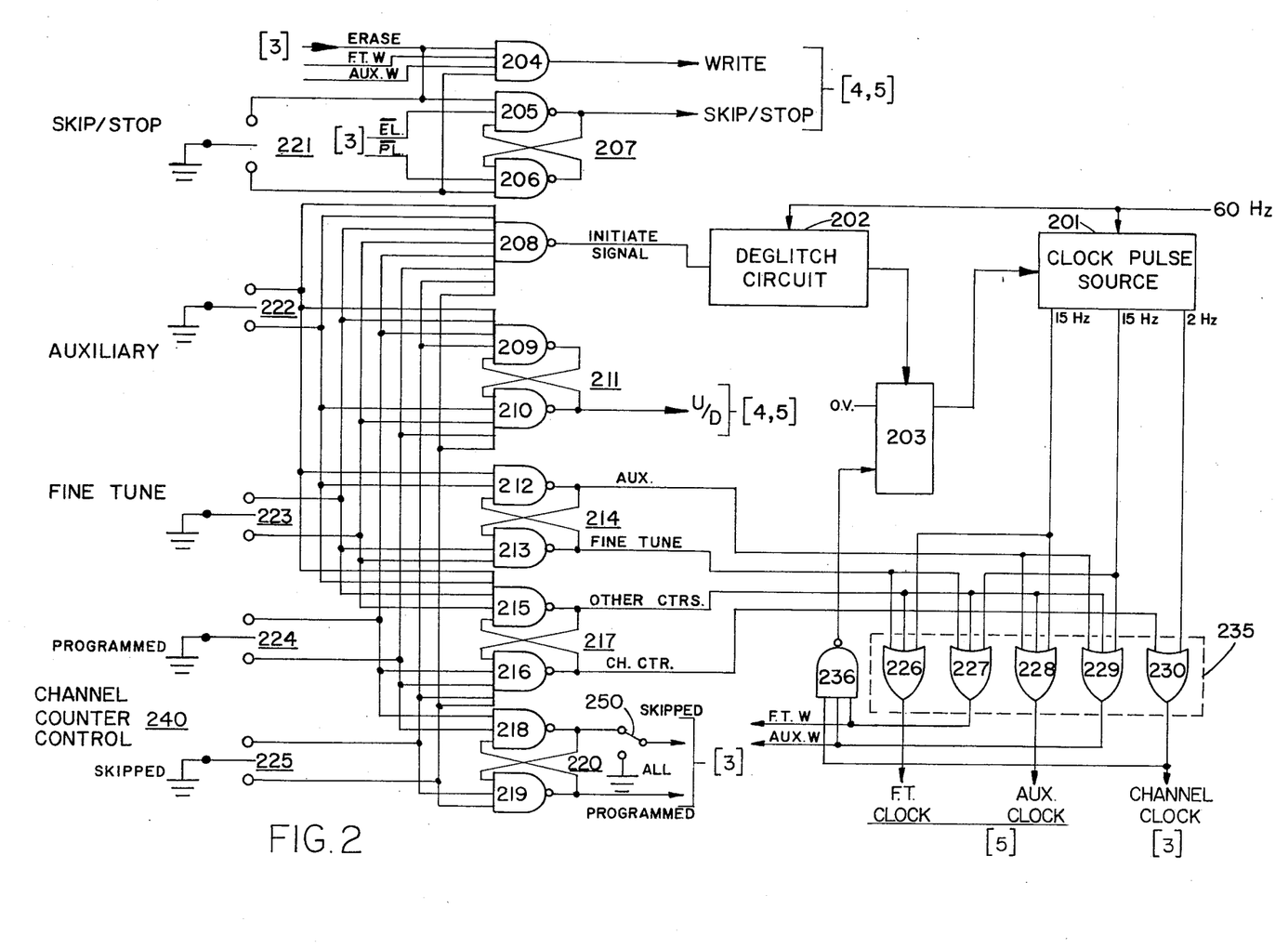
FIG. 2 is a schematic diagram of input logic circuit 200 of FIG. 1.

INPUT LOGIC 200 (FIG. 2)

Input logic 200 contains the operating switches and electronics for the various counters and memories in the system. A clock pulse source 201 is supplied with a 60 Hz input and produces an approximate 2 Hz output and non-overlapping two phase 15 Hz outputs. These signals are supplied to one input of a plurality of OR gates 226–230 comprising a state decoder 235. The output of OR 226 carries the fine tune clock signal, the output of 227 the fine tune write (FTW) signal, 228 the auxiliary clock signal, 229 the auxiliary write signal (AUX. W) and the output of OR 230 carries the channel clock signal.

The outputs of state decoder 235 are also supplied to a NAND gate 236 which drives a flip flop (FF) 203 for controlling operation of clock pulse source 201. NAND 236 and FF 203 assure that the clock pulse source outputs are maintained until completion of a cycle. A conventional deglitch circuit 202 supplies the preset input of FF 203 and is in turn supplied from the 60 Hz source.

Figure 3:
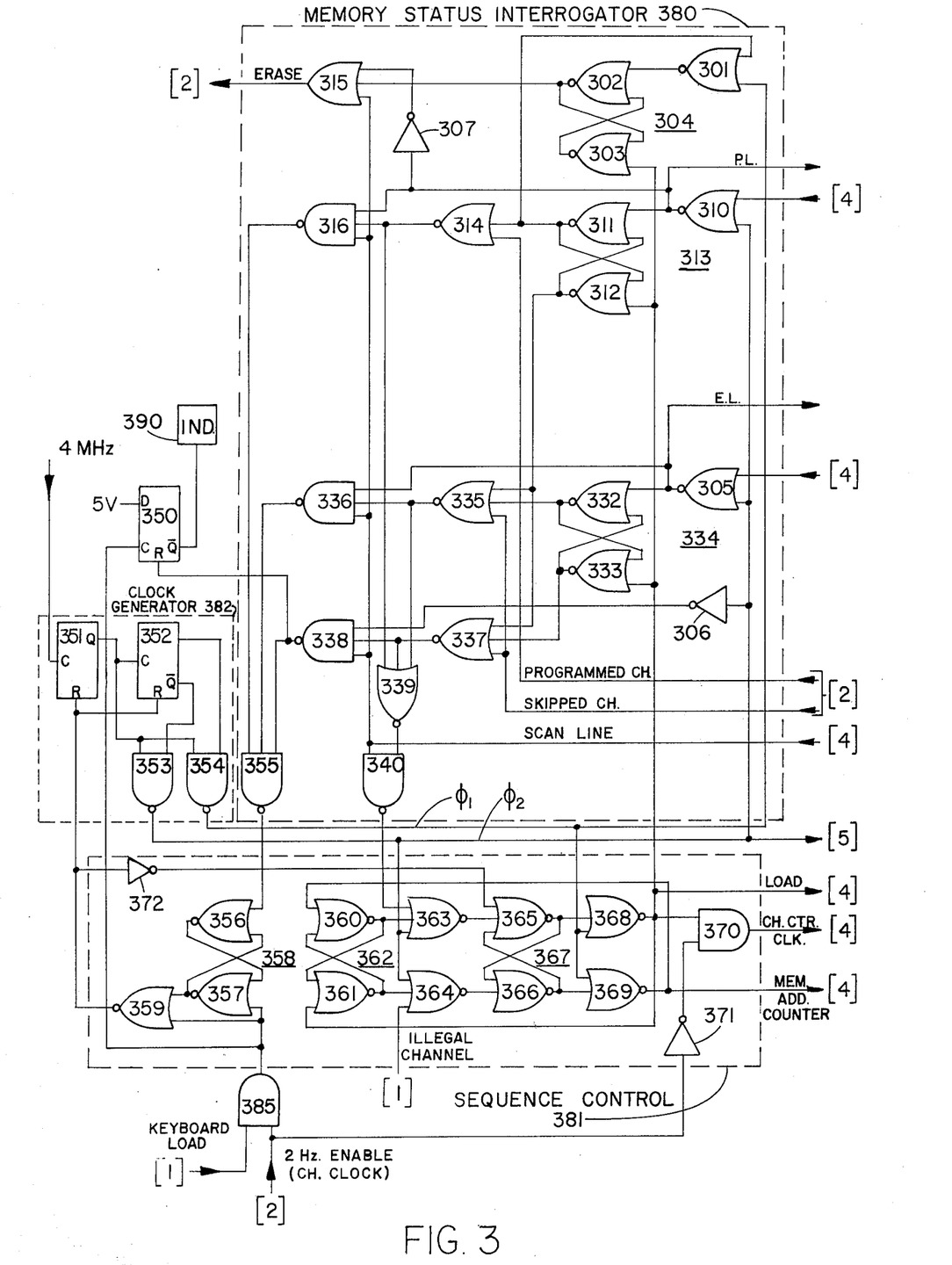
FIG. 3 is a schematic diagram of control logic circuit 300 of FIG. 1.

AND gate 204 and a plurality of NAND gates 205–219 have their inputs connected to a group of momentary-contact, single-pole, double-throw switches 221–225. Switch 221 constitutes a skip/stop switch and, depending upon which of its two poles is grounded, results in either a skip or stop signal, along with a simultaneous write signal being sent to the memories. The fine tune write and auxiliary write signals along with an erase signal from FIG. 3 are coupled to the inputs of AND 204. AND 204 produces the write signal responsive to grounding of either pole of switch 221. Inverted PL and EL signals are supplied from the control logic to NANDS 206 and 205, respectively. NANDS 205 and 206 are cross-coupled to form an RS FF 207, the output of which produces the skip/stop signal. Each of the remaining switches supplies a multiple input NAND 208 which provides an initiate signal to commence a system cycle. The output of NAND 208 is connected to the input of deglitch circuit 202 which guards against the system confusing momentary electrical disturbances as switch closures.

NAND's 209 and 210 are cross-coupled to form an RS FF 211 which produces an up/down signal U/D responsive to closure of any of switches 222–235. Auxiliary switch 222 and fine tune switch 223 are arranged to cause RS FF 214 (comprising cross-coupled NAND's 212–213) to produce an appropriate signal on an auxiliary line or a fine tune line, respectively, in response to activation. Similarly, a switch 224 labelled programmed and switch 225 labelled skipped in a channel counter control 240 are arranged with respect to an RS FF 220 (comprising cross-coupled NAND's 218 and 219) to produce appropriate signals on the skipped line and programmed line. An RS FF 217 comprising cross-coupled NAND's 215 and 216 produce appropriate signals on the other counter line and channel counter line in response to operation of any of the other counters or the channel counter control, respectively. The outputs of RS FF's 214 and 217 are connected to the inputs of NOR's 226–230 in state decoder 235 and in conjunction with the outputs of clock pulse source 201 produce appropriate clock and write signals for the system.

The outputs of RS FF 220 are supplied to the control logic and determine its operational sequence. An auxiliary switch 250 is provided in series with the skipped line. Thus the skipped line may either be grounded or connected to the output of NAND 218 depending upon the particular type of operation desired.

When switch 225 is closed, the system steps among all unprogrammed channels in channel number sequence, in the direction determined by the grounded pole. With auxiliary switch 250 grounding the skipped line, operation of switch 225 results in the channel number counter sequencing through all channels, both programmed and unprogrammed (skipped), in numerical order. With auxiliary switch 250 connected as indicated, operation of switch 225 results in the channel counters sequencing through only the skipped channels. The auxiliary switch arrangement provides a degree of flexibility for the viewer heretofore unobtainable. Operation of switch 224 results in sequencing through all programmed or "saved" channel numbers for normal viewing. The channel numbers may be conveniently transferred from one category to the other as will be seen. It should be remembered that irrespective of the position of the auxiliary switch or activation of the programmed or skipped switch in the channel counter control, every generated channel number results in the receiver being tuned to the corresponding FCC allocated frequency. If there is a station within range transmitting on that frequency, its signal will be received.

CONTROL LOGIC 300 (FIG. 3)

The control logic includes three groups of gates, the first arranged as a memory status interrogator, the second as a sequence control and the third as a clock generator. The memory status interrogator is generally designated by a dashed line block 380, the sequence control by a dashed line block 381 and the clock generator by a dashed line block 382. The system has different operating modes, one of which is direct access via a keyboard input of a two digit channel number, a second is sequencing through programmed or "saved" channels and the third is sequencing through only skipped channels. An all-channel variation in the third mode allows sequencing through both programmed and skipped channels.

In the direct access mode a two digit channel number input from the keyboard forces the channel number counters to produce the selected channel number. This is similar to operation in the third or skip mode with the all-channel variation and will be described together. Briefly, the channel number memory is interrogated by the memory address counter to determine if that channel number is included among those programmed or "saved". The memory address counter scans twice through the channel number memory locations. On the first scan, the presence or absence of the channel number is determined and whether there are any unused memory locations. On the second scan, the memory address counter is stopped at the appropriate channel number memory location if the number is programmed and the corresponding receiver adjustment information in the other accessed memories is supplied to the system. If the channel number is not among those that have been programmed the memory address counter stops at an unused memory location on the second scan.

Appropriate memory status indications are given to the viewer. For example, if a channel is not saved, a signal to that effect is given so that it may be programmed if desired. If it is not saved and there are no available memory locations, a different signal is given to inform the viewer. During the first scan, any duplicate stored channel numbers that may exist are automatically erased.

Tuning with the channel counter control, results in modified operation. If the skipped channel switch in the channel counter control is operated to sequence through all channels, (variation of skipped channel mode) operation proceeds exactly as above but under control of the skipped channel switch. If the skipped channel switch system is used in the unmodified condition, i.e. with switch 250 ungrounded, the system is sequenced as before except that system operation terminates for non-programmed channel numbers.

If the programmed channel switch in the channel counter control is operated (normal operating mode of receiver) the channel number generator counter is clocked and memory interrogation occurs for the new number (as described above). If the new channel number is not in the memory, a clocking signal is developed at the beginning of the second scan to increment the channel number counters one count. This process continues until the next "saved" channel number is encountered, whereupon a stop signal is produced on the second scan.

Figure 4:
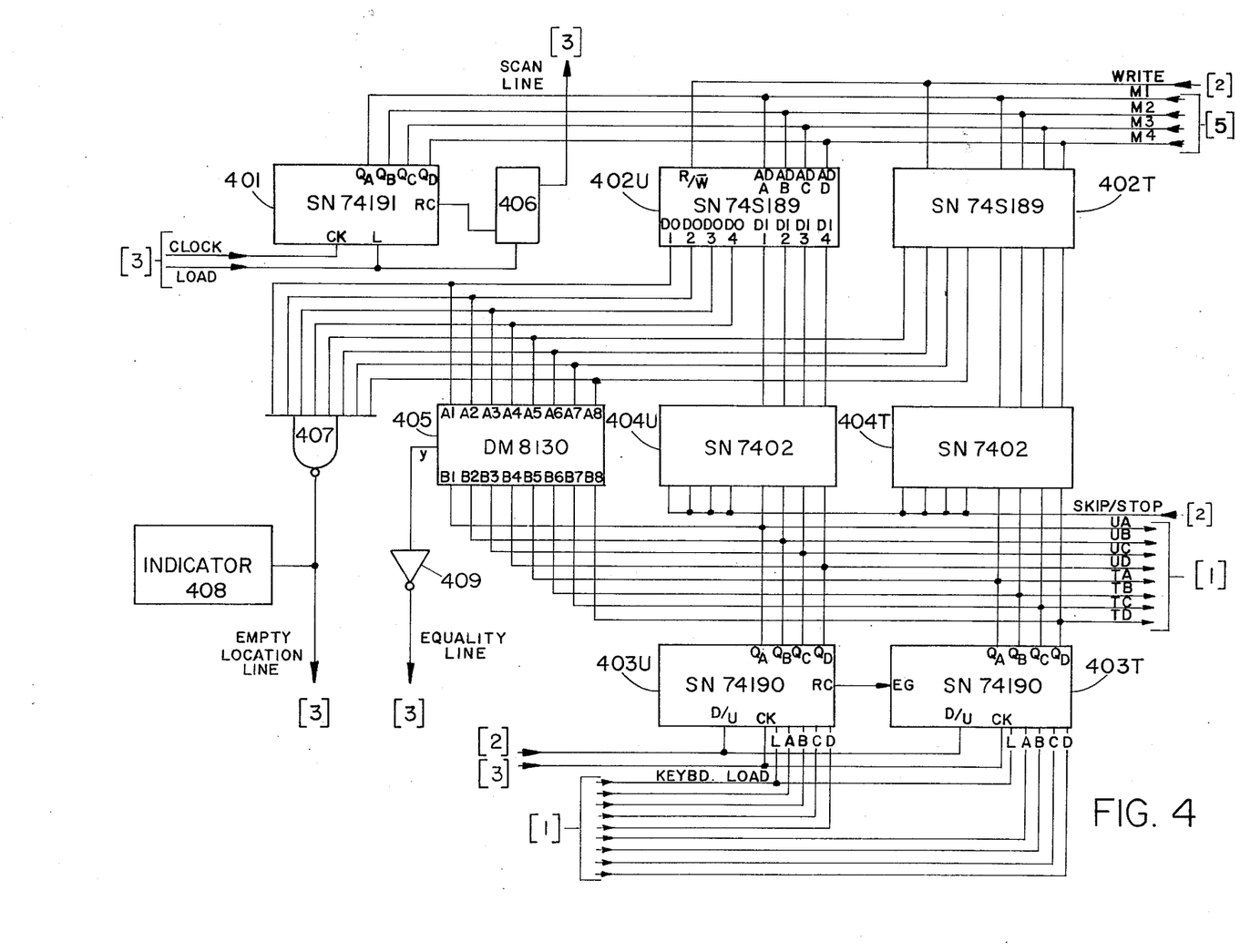
FIG. 4 is a schematic diagram of the channel number apparatus 400 of FIG. 1.

A 4 MHz clock signal is supplied to the clock terminal of a FF 351 having its Q output terminal coupled to the clock terminal of a FF 352. FF's 351 and 352 and NAND's 353 and 354 comprise clock generator 382. The Q terminal of FF 351 is connected to one input each of NAND's 353 and 354, their other inputs being connected to the $\overline{Q}$ and Q terminals, respectively, of FF 352. The output of NAND 354 carries the $\phi_1$ signal and the output of NAND 353 carries the $\phi_2$ signal. $\phi_1$ and $\phi_2$ are nonoverlapping two phase 1 MHz pulse trains. $\phi_1$ is supplied to one input of a pair of NOR's 368 and 369 in sequence control 381 and to an input of a NOR 301 in the erase logic of memory status interrogator 380. $\phi_2$ is supplied to one input each of a pair of NOR's 363 and 364 in the sequence control. In the memory status interrogator it is supplied to an inverter 306, to one input of a NOR 305 in the empty location logic and to one input of a NOR 310 in the channel number equality logic. A NOR 359 which controls operation of clock generator 382 is connected to the reset terminals of FF's 351 and 352 and to a first input of a NOR 365 through an inverter 372. NOR 365 and a NOR 366 are cross-coupled to form an RS FF 367 having its output terminals supplying the remaining inputs of NOR's 368 and 369. The output of NOR 368 is connected to an AND 370 which provides a channel counter clock signal for the channel number counter (FIG. 4). NOR 368 is also connected to an input of NOR 361 in the sequence control and to one input each of NOR's 303, 312 and 333 in the memory status interrogator and also provides a load signal for the memory address counter in FIG. 4. The output of NOR 369 provides a clocking signal for the memory address counter (FIG. 4) and is also supplied to an input of a NOR 360, which is cross-coupled with NOR 361 to form an RS FF 362. The respective outputs of RS FF 362 are supplied to a second input each of NOR's 363 and 364. The last input of NOR 363 is supplied from the output of a sequence control continue NAND 340 in the memory status interrogator. NAND 240 interrogates a continue NOR 339 during the second scan which decodes the outputs of a programmed channel NOR 314, a skipped channel NOR 335 and an overflow NOR 337 and supplies a signal to step the channel counters to a new number when required. The last input of NOR 364 is supplied with a signal from the band decoder (FIG. 1) to preclude stopping on an "illegal" channel number.

NOR's 356 and 357 are cross-coupled to form an RS FF 358, the output of which is coupled to a first input of NOR 359. An AND 385 has a first input supplied with a load signal from the keyboard and a second input supplied with a 2 Hz enable signal from NOR 230 in the input logic state decoder (FIG. 2). The enable signal from NOR 230 is also coupled to the other input of AND 370 through an inverter 371. The output of AND 385 is coupled to the remaining inputs of NOR's 357 and 359 and to the clock terminal of a FF 350. The remaining input of NOR 356 is supplied from the output of a stop NAND 355 which provides a signal for terminating operation of sequence control 381. The D terminal of FF 350 is supplied from a 5 V d.c. source and its $\overline{Q}$ output drives an indicator device 390.

SEQUENCE CONTROL 381 OPERATION

NOR's 360–369 function as a flip flop for enabling the first $\phi_1$ pulse to step the channel number counter in both the programmed and skipped channel modes. AND 370 prevents this channel counter operation when the keyboard is used. Subsequent $\phi_1$ pulses are used to step the memory address counter. The $\phi_2$ pulses are phase delayed with respect to the $\phi_1$ pulses and are used to interrogate the channel number memory after each step to a new location. The $\phi_2$ pulses are inhibited by the illegal channel number signal, thus enabling the channel number counter to step to another channel number. The $\phi_1$ and $\phi_2$ pulses are negative going.

Assume the output of NOR 359 goes high which enables clock generators 382 and RS FF 367. Initially the output of NOR 365 is low and that of NOR 366 high. (NOR 368 is thus enabled and NOR 369 disabled). The 2 Hz enable signal from FIG. 2, through inverter 371, enables AND 370. Therefore the first $\phi_1$ pulse from NAND 354 drives the output of NOR 368 high which through AND 370 steps the channel number counter (FIG. 4) in the direction determined by the U/D signal. It also operates RS FF 362 to drive the output of NOR 361 low and that of NOR 360 high. The illegal channel lead input to NOR 304 is normally low. If an illegal channel number is produced, one input to NOR 364 is high. Since one input of NOR 363 is also high (due to RS FF 362) both NOR's are inhibited. Consequently the $\phi_2$ pulse is ineffective, RS FF 367 is not switched to enable subsequent $\phi_1$ pulses to step the memory address counter and therefore the next $\phi_1$ pulse steps the channel counter again.

If the generated channel number is not an illegal one, the band decoder input to NOR 364 will remain low. Since the output of NOR 361 is also low, NOR 364 is enabled. Upon occurrence of the low level $\phi_2$ pulse, the output of NOR 364 goes high which switches RS FF 367 such that the output of 365 is high and that of 366 is low. Thus NOR 369 is enabled for clocking the memory address counter upon occurrence of subsequent $\phi_1$ pulses.

When the output of NOR 369 goes high (responsive to $\phi_1$) it resets RS FF 362 to make the output of 361 high and that of 360 low, thus enabling NOR 363 and inhibiting NOR 364. However, the output of NAND 340 is normally high and the output of NOR 363 remains low. Further $\phi_1$ pulses are effective to drive the output of NOR 369 high and clock the memory address counter. As will be seen, the $\phi_2$ pulses are used to interrogate the status of the memory comparators and clock the fine tune and auxiliary function counters.

Operation continues as above with the output of NAND 340 being high. If its output goes low, responsive to operation of continue NOR 339, all inputs to NOR 363 are low when $\phi_2$ occurs and RS FF 367 is switched to enable NOR 368 to clock the channel counter again.

MEMORY STATUS INTERROGATOR 380 (FIG. 3)

The remaining input of NOR 310 is supplied with an equality signal (FIG. 4) whenever a programmed channel number in the memory corresponds to the number from the channel number counter. The equality signal constitutes a low logic level voltage, a high logic level indicating non-equality. The output (PL) of NOR 310 is supplied to the skip/stop logic in FIG. 2 and to a first input of a NOR 311, a first input of a NAND 316 and to an inverter 307. The remaining input of NOR 305 is supplied with a signal indicating that the channel number memory (FIG. 4) has an unused location. The output (EL) of NOR 305 is supplied to the skip/stop logic in FIG. 2 and to a first input of a NOR 332 and to a first input of a NAND 336. The inverted $\phi_2$ pulse at the output of inverter 306 is supplied to a first input of a NAND 338.

NOR's 311 and 312 are cross-coupled to form an RS FF 313 having the output of NOR 311 connected to a first input of a NOR 314 and to the remaining input of NOR 301. The output of NOR 312 in RS FF 313 is connected to a first input each of NOR's 335 and 337. The second input of NOR 314 is supplied with the programmed channel signal from the input logic (FIG. 2) whenever the channel counter control is operated to sequence through the programmed channels.

The output of NOR 301 supplies a first input of a NOR 302. NOR's 302 and 303 are cross-coupled to form an RS FF 304, the output of which is supplied to a first input of an OR 315 which produces an erase signal for the channel number memory.

In the empty memory location logic, NOR 332 is cross-coupled with a NOR 333 to form as RS FF 334 having respective outputs supplying a second input of NOR's 335 and 337. The remaining inputs of NOR's 335 and 337 are supplied with the skipped channel signal from the input logic in FIG. 2 when the channel counter control is operated to sequence through the skipped or non-programmed channels. When a low level signal is present, the system operates to stop at all skipped channel numbers only. When both the programmed and skipped channel signals are low, the system is conditioned to stop at all channels, both skipped and programmed. (This is because programmed channels NOR 314 is also enabled in all-channel variation). The output of the skipped channel decoder NOR 335 is connected to the second input of NAND 336 and to a first input of continue sequence decoder NOR 339. The output of NOR 337 is supplied to a second input of NAND 338 and a second input of NOR 339.

Programmed channels NOR 314 is connected to a second input of NAND 316 and the last input of NOR 339. Inverter 307 is connected to the second input of erase OR 315. The output of NOR 339 is connected to a first input of NAND 340. The remaining inputs of OR 315 and NAND's 316, 336, 338 and 340 are supplied with the scan signal which is low for the first scan and high for the second. The scan signal enables OR 315 on the first scan of the channel number memory and enables NAND's 316, 336, 338 and 340 on the second scan of the memory. The outputs of NAND's 316, 336 and 338 are connected to a stop NAND 355. NAND 338 also supplies the reset terminal of FF 350.

MEMORY STATUS INTERROGATOR 380 OPERATION

When a channel change is initiated, the output of NOR 368 goes high and resets RS FF's 304, 313 and 334 such that the output of NOR's 302, 311 and 332 are all high. Assume that operation has been selected for sequencing through programmed channels. The programmed channel line is low and programmed channels NOR 314 enabled. The skipped channel line is high disabling skipped channels NOR 335 and overflow NOR 337. The memory address counter is stepped in response to the $\phi_1$ pulses and assume further that a memory location bearing the new channel number is found. The equality line goes low and when the next $\phi_2$ pulse occurs, the output of NOR 310 goes high, setting RS FF 313 with the output of NOR 311 being low and that of NOR 312 being high. NOR 314 goes high and simultaneously enables NAND 316 and inhibits continue sequence control NOR 339.

During the first scan, the scan line is low and NAND's 316, 336, 338 and 340 are disabled whereas OR 315 is enabled. During the second scan, the scan line goes high with the opposite effect. In the second scan, when the memory address counter interrogates a memory location with the proper stored channel number, NOR 310 again produces a high output which, when applied to the input of NAND 316, forces its output low. This activates stop NAND 355 causing RS FF 358 to reset and prevent further operation of clock generator 382. If no equality signal occurs all inputs to continue NOR 339 are low, enabling NAND 340 which during the second scan reinitiates sequence control 381. Operation continues until a programmed channel number is encountered.

Automatic erasure of duplicate stored channel numbers is also accomplished. During the first scan the first equality indication results in the output of NOR 311 going low. The next $\phi_1$ pulse forces the remaining input of NOR 301 low, and its output goes high, setting RS FF 304 such that the output of NOR 302 is low. Another input of OR 315 is low during the first scan because the scan line is low. Thus during the first scan two of the three inputs to OR 315 are low and OR 315 is fully enabled. A subsequent finding of equality again drives the output of NOR 310 high and through inverter 307 forces the remaining input of OR 315 low. Thus the output of OR 315 will go low producing an erase signal for erasing the second equality in the memory. Any further findings of equality in the memory channel locations will automatically be erased in the same manner.

When the receiver is being operated in the skipped channel mode, NOR's 335 and 337 are enabled by the low logic level on the skipped channel line and NOR 314 is disabled by the high logic level of the programmed channel line. RS FF's 304 and 313 operate as discussed above. Operation proceeds normally with the 2 Hz enable signal being applied to sequence control 381 and clock generator 382. If an empty number location is encountered in the channel number memory, a low logic level signal is developed on the empty location line which is connected to NOR 315. NOR 305 is enabled by the $\phi_2$ pulse and produces a high logic level pulse EL at its output causing RS FF 334 to be set and drive the output of NOR 332 low and the output of NOR 333 high. If the equality line is low, indicating that the channel number is in the memory, NOR 312 in RS FF 313 inhibits NOR's 335 and 337 by placing a high level signal on their inputs. If the equality line remains high, NOR 312 remains low and NOR's 335 and 337 are enabled. NOR's 335 and 337, in being enabled simultaneously, inhibit continue NOR 339 and enable stop NAND 355. The latter is enabled through decoder NAND's 336 and 338. It will be noted that all the inputs to NAND 336 will be high on the second scan when an unused location is present.

When the memory is full in the skipped channel mode, a special stop signal is needed to prevent continuous operation of the system. The output of NOR 312 is low since the equality line is high, indicating no equality. The output of NOR 333 is also low since there is no empty location in the memory and the skipped channel line is low. Consequently overflow NOR 337 is enabled (during the second scan) producing a high input to continue NAND 339, thus disabling it. The high input is also applied to decoder NAND 338 along with the inverted $\phi_2$ pulse and the high level scan signal causing NAND 338 to operate and forcing stop NAND 355 to terminate operation of the sequence control.

FF 350 controls the memory full indicator 390 as is initially set by the channel change signal from AND 385 such that its $\overline{Q}$ is low. When a full memory is indicated by the output of NAND 338 going low, $\overline{Q}$ of FF 350 goes high and turns on indicator 390.

In the all-channel variation of the skipped mode, both the programmed and skipped lines are low thus enabling NOR's 314, 335 and 337 and the system stops for both programmed and skipped channel numbers. In the direct access mode operation is identical and the keyboard load signal initiates both the sequence control and the clock generator.

CHANNEL NUMBER APPARATUS 400 (FIG. 4)

This apparatus consists of standard "off-the-shelf" items and bears the commercial part number and terminal designations. The channel number counters 403U and 403T are operated by clocking pulses from the sequence control or directly set to a desired number by keyboard operation. A plurality of leads from the keyboard in FIG. 1 carrying binary coded decimal tens and units digits information and a keyboard load lead are connected to the number counters. In sequencing operation, a D/U signal is supplied from the input logic in FIG. 2 and the channel counter clock signal is supplied from the sequence control in FIG. 3. The outputs of units counter 403U are coupled to corresponding inputs of a units selective NOR gate 404U and the outputs of tens counter 403T connected to tens selective NOR gates 404T. The outputs of the selective NOR gates are coupled to the $DI_1-DI_4$ terminals of a units channel number memory 402U and a tens channel number member 402T, respectively. The other input terminals of the selective NOR gates are connected together and supplied with the skip/stop signal from NAND 205 in FIG. 2. The channel number counter outputs, respectively labelled UA-UD and TA-TD are supplied to the band decoder, decoder/display and tuning voltage generator in FIG. 1. These outputs also feed the "B" inputs of a comparator 405 whose "A" inputs are supplied from the $DO_1-DO_4$ outputs of units memory 402U and tens memory 402T. The Y output of comparator 405 is inverted by an inverter 409 and constitutes the equality line for the memory status interrogator in FIG. 3.

The units and tens channel number memories are addressed at their $AD_A-AD_D$ terminals from the memory address counter leads M1-M4. Load and clock signals are supplied to the address counter from the sequence control in FIG. 3. Since leads M1-M4 also extend to the receiver adjustment apparatus memories in FIG. 5, the address output of counter 401 accesses all of these memories simultaneously. A flip flop 406 is coupled to the memory address counter and is clocked along with it. The output of FF 406 constitutes the scan line for the memory status interrogator in FIG. 3. When the memory address counter has cycled once, FF 406 changes state and switches the logic level on the scan line from low to high as previously described.

The selective NOR gates 404U and 404T invert the logic levels on their input leads during transfer of information to the memories. Information is transferred from the counters to the memories during occurrence of a write signal when the skip/stop line is low. When the skip/stop line is high during occurrence of a write signal, the selective NOR gates are "forced" to a 0 logic output resulting in a 0 logic level being placed in the memory upon occurrence of a write pulse. These 0's in the channel number memory represent an empty memory location.

The memories also invert information logic levels between their inputs and outputs. Consequently, an empty location is read out as a series of 1's on the $DO_1-DO_4$ leads. These leads (from each of the memories 402U and 402T) are inputs to a NAND 407 which serves as an empty memory location detector. The output of this NAND supplies the empty location lead for the memory status interrogator in FIG. 3. It is also coupled to an indicator 408 which yields a visual indication of the system status, i.e. whether a skipped or programmed channel is being viewed.

Figure 5:
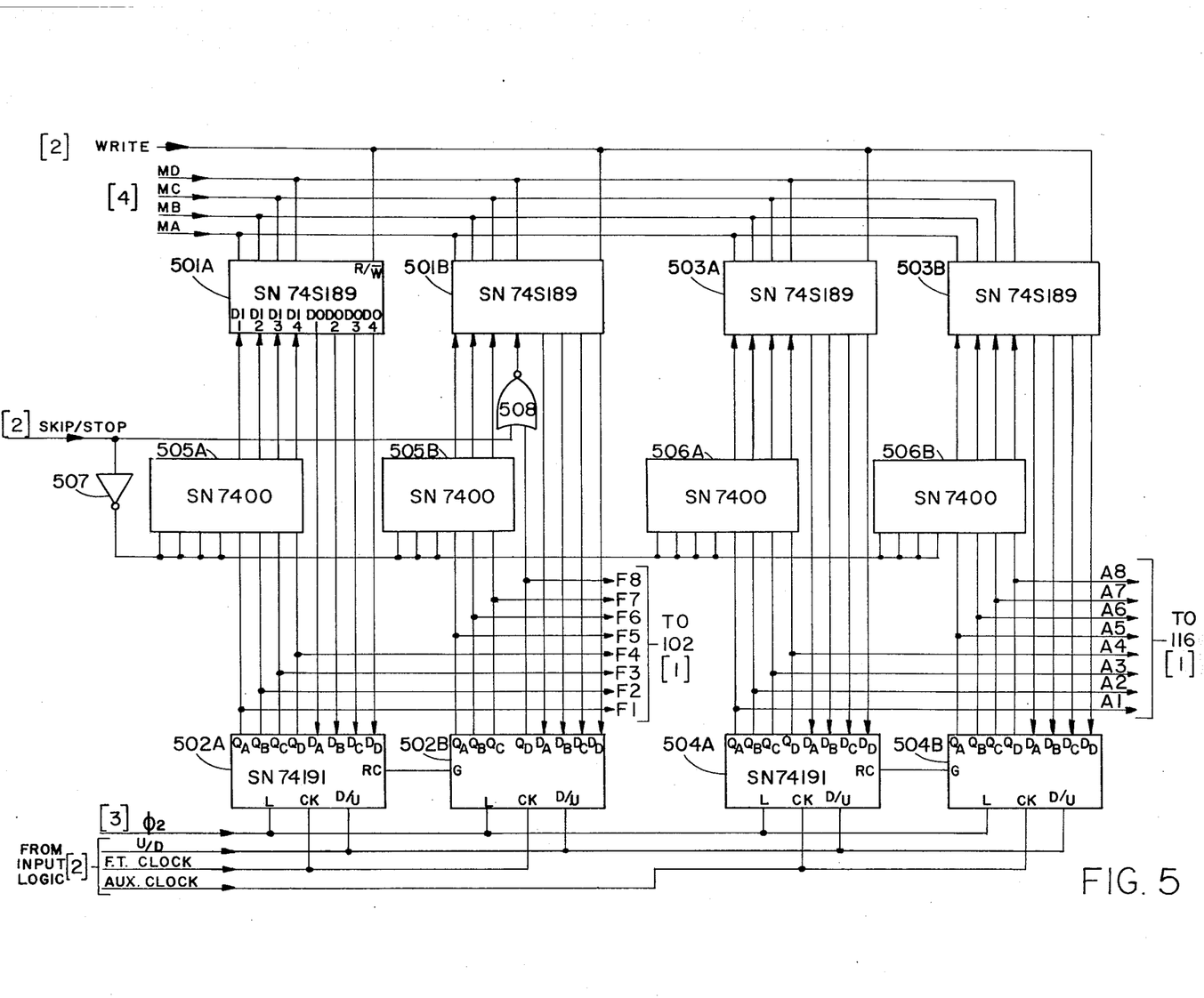
FIG. 5 is a schematic diagram of the receiver adjustment apparatus 500 of FIG. 1.

RECEIVER ADJUSTMENT APPARATUS (FIG. 5)

For simplicity only two functions in the receiver adjustment apparatus are illustrated, fine tuning and auxiliary. As mentioned earlier, it will be obvious that the apparatus and technique illustrated may be extrapolated to as many functions as desired to enable optimum tuning and control of the receiver for selected channels.

A pair of counters 502A and 502B, respectively are provided in the fine tune portion of the receiver adjustment apparatus. A corresponding pair of memories 501A and 501B have their address inputs coupled to the appropriate memory address counter lines MA-MD. The write line from the input logic in FIG. 2 is coupled to the $R/\overline{W}$ terminals of memories 501A, 501B, 503A and 503B. The QA-QD outputs of the counters are coupled to a series of leads F1-F4 and F5-F8, respectively which supply tuning voltage generator 102 in FIG. 1. The tuning voltage generator will be understood to include well-known apparatus for developing both a coarse and a fine tune voltage for the receiver based upon the information received from channel number counter 403 and fine tune counter 502.

Similarly, a pair of auxiliary counters 504A and 504B and corresponding auxiliary memories 503A and 503B are provided with their QA-QD output leads supplying corresponding lines A1-A4 and A5-A8, respectively for controlling auxiliary function block 116 in FIG. 1.

Information transfer between the counters and the memories requires "memory set" logic. For the fine tune section, this is included in blocks 505A, 505B and NOR 508 and for the auxiliary section is included in blocks 506A and 506B. These blocks include a plurality of NAND's. NOR 508 has one input supplied from QD of counter 502B and its other input coupled to the skip/stop line. The output of NOR 508 is connected to the $DI_4$ input of fine tune memory 501B. An inverter 507 couples the skip/stop line to the first inputs of the blocks in the memory set logic. Their other inputs are connected to the outputs of the respective counters. The outputs of the blocks are connected to the "DI" inputs of the respective memories. All counter inputs are supplied with the $\phi_2$ signal at their load terminals and the up/down signal U/D at their D/U terminals. These signals load the adjustment information in the memories into the respective counters during operation of the sequence control. The appropriate clock signals, i.e. fine tune or auxiliary, are supplied to their CK terminals.

In the disclosed system, the fine tune counters are nominally set at mid-range corresponding to a binary count of 1000-0000. (Zero fine tuning would be binary 0000-0000 and maximum fine tuning would be binary 1111-1111.) Consequently, under nominal conditions NOR 508 is activated by the skip/stop line to impress a 1 in the eighth bit of memory 501B and blocks 505A and 505B impress 0's in the other seven bits of memory to produce the appropriate fine tune mid-range condition above. In the auxiliary memory a nominal value of bindary 0000-0000 is impressed in a similar manner. The number of bits shown is illustrative only—the actual number will be dependent upon the desired resolution.

Channel numbers may be programmed into empty memory locations by actuating the skipped channel switch to tune the receiver to the desired channel and moving the skip/stop switch to the stop position momentarily. To delete a programmed channel (accessed by the programmed channel switch), the skip/stop switch is momentarily moved to the skip position. Adjustments are "written" into the memories as they are made when operating on programmed channels. Adjustments may be made but are not entered into the memories when operating in the skipped channel mode. For an empty channel number memory location, all information placed in the corresponding other memories is selected to produce nominal settings of the associated receiver adjustment apparatus. However the individual receiver function adjustment counters may always be adjusted by the viewer to produce a picture to his liking no matter what the operating mode of the receiver.

All labelled integrated circuit logic apparatus is available from Texas Instruments Corporation except for DM8130 which is available from National Semiconductor. The unused terminals of the apparatus are to be connected as follows:

|  | 0 volts | 5 volts |
|---|---|---|
| SN74190 |  | EG |
| SN74191 | $D_A D_B D_C D_D D/U$ | L, EG |
| SN14S189 | $\overline{CE}$ |  |
| DM8130 | A9,A10,B9,B10, S |  |
| SN7400 | A,B |  |

What has been described is a novel tuning system for a television receiver which may be tuned directly (or through sequencing of a channel counter control) to any television channel with selected ones of the total number of available channels having receiver function adjustment memories which are individually programmable to a high level of sophistication.

It is recognized that while particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. An all-channel television receiver comprising:
   means generating channel numbers;
   tuning means tuning said receiver to the channel indicated by the generated channel number;
   limited location memory means for storing channel numbers, channel tuning voltages and additional channel-number-related receiver adjustment information;
   means scanning said memory means locations for stored channel numbers responsive to generated channel numbers;
   read-out means for extracting said channel tuning voltages and said additional receiver adjustment information responsive to generation of its corresponding channel number; and
   means for programming said memory locations with desired channel numbers, channel tuning voltages and additional channel-number-related receiver adjustment information.

2. An all-channel television receiver as set forth in claim 1 further including means indicating the status of said memory for each generated channel number.

3. An all-channel television receiver as set forth in claim 2 wherein said indicating means conveys information about storage of additional adjustment information for the generated channel number.

4. An all-channel television receiver as set forth in claim 3 wherein said indicating means conveys information about memory location availability.

5. An all-channel television receiver comprising:
   a channel number counter for generating channel numbers;
   means for tuning said receiver to the channel corresponding to the generated channel number;
   a memory having a limited number of locations for storing channel numbers, channel tuning voltages and channel number-related additional receiver adjustment information;
   a memory address counter for sequentially scanning said locations for stored channel numbers, channel tuning voltages and channel number-related information and empty memory locations, responsive to operation of said channel number counter;
   means indicating the status of said memory for all channel numbers generated;
   read out means extracting said channel tuning voltages and additional receiver adjustment information corresponding to generated channel numbers;
   means for programming said memory with desired channel numbers, channel tuning voltages and additional receiver adjustment information; and
   means producing a control signal related to said extracted channel tuning voltages and additional receiver adjustment information for application to said receiver.

6. The television receiver of claim 5 wherein the memory status indicating means indicates whether the generated channel number is programmed in the memory.

7. The television receiver of claim 6 wherein the status indicating means indicates whether there is an empty memory location available for storage of a channel number, channel tuning voltage and related additional receiver adjustment information.

8. The television receiver of claim 7 wherein said memory address counter scans said memory locations for each channel number generated.

9. The method of operating a television receiver tuneable to any channel by its channel number and including a limited-location memory for storing channel numbers, channel tuning voltages and channel number-related additional receiver adjustment information comprising:
   tuning said receiver to a selected channel;
   scanning said limited-location memory to determine the presence of the selected channel number, channel tuning voltage and additional receiver adjustment information corresponding to the selected channel;

reading out said channel tuning voltage and said additional receiver adjustment information, if present; and producing appropriate signals for said receiver based upon said channel tuning voltage and said additional receiver adjustment information.

10. The method of claim 9, further including the step of:

searching said limited-location memory for an available location when there is no adjustment information corresponding to the selected channel number.

11. The method of claim 10 wherein said receiver includes a counter for sequentially scanning said memory, and including the further step of:

operating said counter during said scanning step to scan said memory whenever a channel number is selected.

12. The method of claim 11, further including the step of:

generating a signal indicative of the status of said memory for any selected channel.

13. The method of claim 12, further including the additional step of:

generating a signal indicative of location availability in said memory.

* * * * *